United States Patent
Lee et al.

(10) Patent No.: US 7,066,623 B2
(45) Date of Patent: Jun. 27, 2006

(54) METHOD AND APPARATUS FOR PRODUCING UNTAINTED WHITE LIGHT USING OFF-WHITE LIGHT EMITTING DIODES

(76) Inventors: Soo Ghee Lee, 11, Jalan Bunga Telang, 11200 Penang (MY); Kee Yean Ng, 6, Halaman Kikik, Taman Inderawash, 13600 Pral, Penang (MY); Meng Ee Lee, 343, MK10 Bukit Kecil, 1400 Bukit Mertajam, Penang (MY)

( * ) Notice: Subject to any disclaimer, the term of this patent is extended or adjusted under 35 U.S.C. 154(b) by 96 days.

(21) Appl. No.: 10/742,688

(22) Filed: Dec. 19, 2003

(65) Prior Publication Data

US 2005/0135094 A1 Jun. 23, 2005

(51) Int. Cl.
*F21V 9/00* (2006.01)

(52) U.S. Cl. ........................ 362/230; 362/231; 362/236; 257/103; 313/498

(58) Field of Classification Search ................ 362/230, 362/231, 236, 240; 257/103; 313/503, 504, 313/506, 509, 498
See application file for complete search history.

(56) References Cited

U.S. PATENT DOCUMENTS

| | | | | |
|---|---|---|---|---|
| 5,803,579 A | * | 9/1998 | Turnbull et al. | 362/516 |
| 5,998,925 A | | 12/1999 | Shimizu et al. | |
| 6,513,949 B1 | * | 2/2003 | Marshall et al. | 362/231 |
| 6,672,734 B1 | * | 1/2004 | Lammers | 362/612 |
| 6,794,686 B1 | * | 9/2004 | Chang et al. | 257/89 |
| 2003/0156425 A1 | * | 8/2003 | Turnbull et al. | 362/545 |
| 2004/0105261 A1 | * | 6/2004 | Ducharme et al. | 362/231 |
| 2004/0120140 A1 | * | 6/2004 | Fye et al. | 362/84 |
| 2005/0093422 A1 | * | 5/2005 | Wang et al. | 313/487 |

* cited by examiner

*Primary Examiner*—Sandra O'Shea
*Assistant Examiner*—Jacob Y. Choi (57) ABSTRACT

A white light emitting device by using off-white light emitting diodes (LED's). Rather than using just pure white LEDs, the white light emitting device arranges those LEDs which exhibit off-white colors in a manner such that the combination of light emanating from these off-white LEDs produces a radiation which appears substantially pure white to the human eye.

9 Claims, 6 Drawing Sheets

METHOD AND APPARATUS FOR PRODUCING UNTAINTED WHITE LIGHT USING OFF-WHITE LIGHT EMITTING DIODES

FIELD

The present invention relates to a method and apparatus for producing untainted white light using off-white light emitting diodes (LED's). More particularly, the present invention pertains to a way of combining different hues of white light from complimentary LED's to create a more "pure" white light.

BACKGROUND

A white LED couples two light emitting materials. The first is a blue light emitting diode made of semiconductor material capable of emitting radiation (i.e. the "initial radiation") when electric current flows through it. The second is a yellow fluorescent or luminescent wavelength-converting material that absorbs a portion of the initial radiation and emits light (i.e., the "second radiation") of a wavelength different from the initial radiation. The resultant light is the combination of the second radiation with the unconverted portion of the initial radiation. In a white LED, the diode emits blue light for the initial radiation, and the wavelength-converting material emits yellow light for the second radiation.

Figure 1:
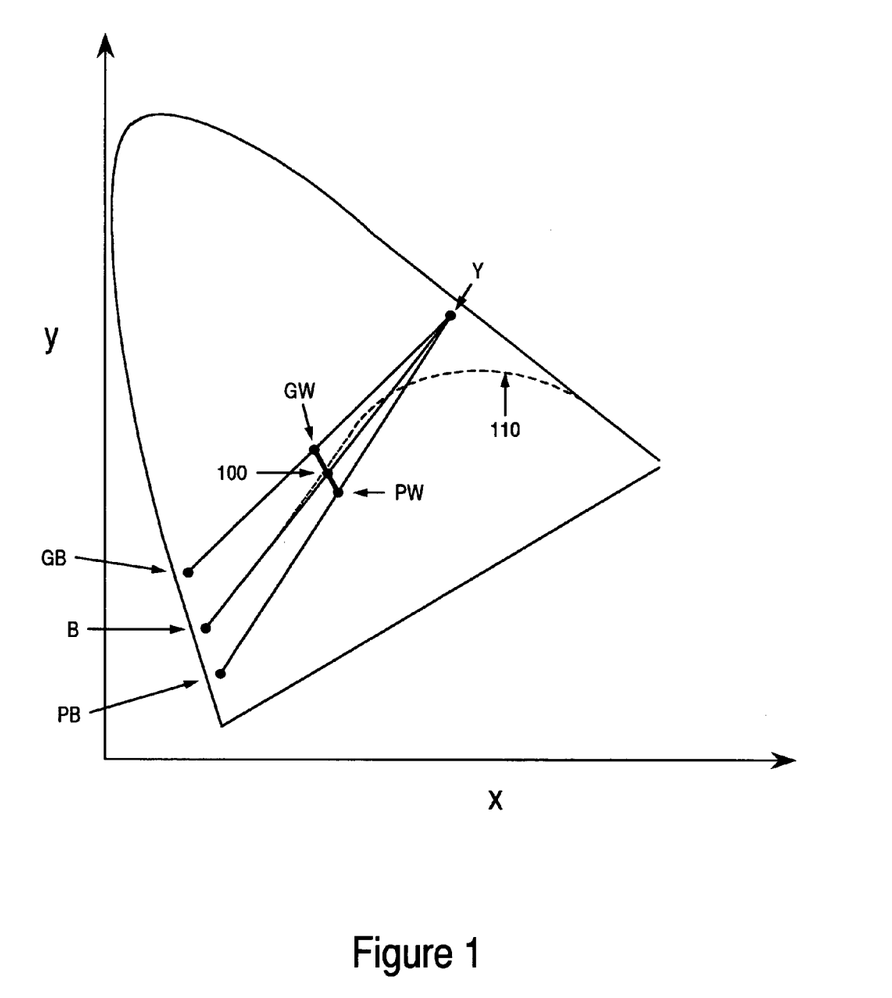
FIG. 1 is a representation of the 1931 CIE (Commission International d'Elchairge) Chromaticity Diagram.

One desired resultant radiation in white LED's is untainted white light. There are many different types of white light, e.g. bluish-white, also known as cool-white, and yellowish-white, also known as warm-white. "Pure" white light, i.e. untainted white light, is desired in situations where the equivalent of daylight is needed, such as the flash for an image capturing device. "Pure" white light has been quantified. FIG. 1 is the 1931 CIE (Commission International d'Elchairge) Chromaticity Diagram. The dotted line 110 represents the black body curve. The color of radiation from a black body is dependent only on its temperature. In the lighting industry, it is common to designate a white color with its associated color temperature. Point 100 is "pure," untainted white light, and its associated color temperature is 6500 Kelvins. This is, incidentally, the reference white for the National Television System Committee. Point 100 is the desired hue for a white light emitting device like an image capturing device.

Most white LED's employ a common yellow phosphor such as Cerium activated Yttrium Aluminum Garnet (YAG: Ce) as the wavelength converting material. To achieve untainted white light with this phosphor, the blue initial radiation typically has a wavelength which falls between 465 and 470 nanometers. If the initial radiation is too greenish-blue (i.e. greater than 470 nm), the resultant white light will be greenish. If the initial radiation is too purplish-blue (i.e. less than 465 nm), the resultant white light will be purplish. Both of these tainted hues of white can be perceived by the human eye, and are known as "impure" whites. These tainted hues have color coordinates that lie distal from the black body curve in FIG. 1. If either of these impure white lights is used in the flash for an image capturing device, the resulting images will also be tainted.

The color of blue light emitted by blue semiconductor material as fabricated by epiaxial semiconductor growth processes typically ranges from 460–480 nm despite having a controlled process. Consequently, only about 25% of the available blue semiconductor material fabricated by this process can be used in diodes for "pure" white LED's. The remaining 75% emits blue light which is either too greenish or too purplish and cannot be used for this purpose. Therefore the production cost of "pure" white LED's is very high.

Thus, there is a need in the industry for a method or apparatus for generating untainted white light from LED's in a more economically feasible manner. The present invention provides a unique, novel solution to this problem.

SUMMARY

A white light emitting device by using off-white light emitting diodes (LEDs) is disclosed. Rather than be limited to using just pure white LED's, the white light emitting device arranges those LED's which exhibit off-white colors in a manner such that the combination of light emanating from these off-white LEDs produces a radiation which appears substantially pure white to the human eye.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

The present invention is illustrated by way of example, and not by way of limitation, in the figures of the accompanying drawings and in which like reference numerals refer to similar elements in which:

The result of combining the initial and second radiation in an LED can be illustrated on the Chromaticity Diagram (FIG. 1). A line is drawn between the points representing the color of the initial radiation and the second radiation, in this case blue and yellow respectively. The resultant light has a color coordinate point that lies along this line. Point "B" is blue light. Point "Y" is yellow light. The color coordinate point of "pure" white light lies along line B-Y, in the vicinity of the black body curve. Point "GB" is greenish-blue light. Point "GW," or greenish-white light, lies along line GB-Y.

Point "PB" is purplish-blue light. Point "PW," or purplish-white light, lies along line PB-Y.

In one embodiment of the invention, the LED's are chosen such that an LED which has a color coordinate on one side of the black body curve is arranged close to another LED that has a color coordinate that lies on the other side of the black body curve. The resultant color lies along the locus of the straight line joining these color coordinates and therefore lies closer to the black body curve. White LED's with greenish-white and purplish-white colors can be suitably arranged to yield a radiation that appears substantially white to the eye.

In one embodiment of the invention, the greenish-white LED is made using a blue diode with 480 nm color and the purplish-white LED made using a blue diode with 460 nm color. In an alternative embodiment, the greenish-white LED is made using a blue diode with 475 nm color and the purplish-white LED is made using a blue diode with 465 nm color.

In this way, the range of blue diodes that can be used is wider than 5 nm. Consequently, the rate of utilization of blue diodes is increased and the cost of production is decreased.

Using FIG. 1, the color coordinates of the combination of any two points on the Chromaticity Diagram lies along the line connecting these two points. Hence, point 100 lies on line GW-PW in the vicinity of the black body curve and is substantially a "pure" white light. The proportions of the greenish-white light and the purplish-white are suitably chosen such to yield white light at point 100, close to or at the black body curve.

Figure 2A:
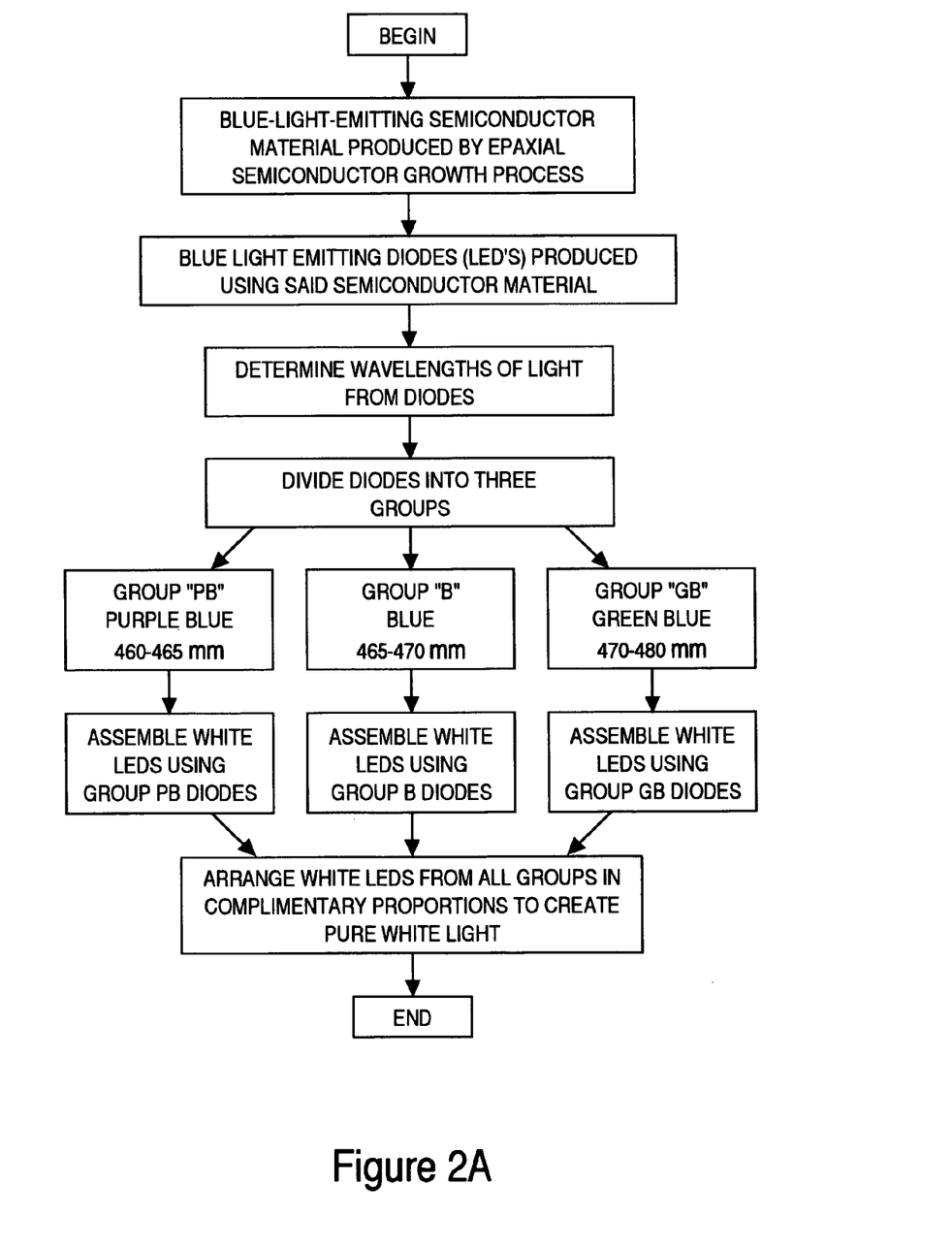
FIG. 2A is a flow chart illustrating a process for dividing blue diodes, assembling white LED's with them, and arranging the LED's such that their composite light is "pure" white light.

FIG. 2A illustrates a system of sorting blue diodes according to the wavelength of the light they emit. White LED's are them assembled using the divided blue diodes. Said LED's are then arranged on a device such that their combined light is untainted white. Hence, white LED's can be made using 100% of blue semiconductor material produced by conventional processes. Blue diodes are divided into three groups, PB, B, and GB, depending on the wavelength of the blue light of each. Group PB consists of purplish-blue diodes which emit light in the 460–465 nm range. Group B consists of blue diodes which emit light in the 465–470 nm range. Group GB consists of greenish-blue diodes emitting light in the 470–480 nm range.

Figure 2B:
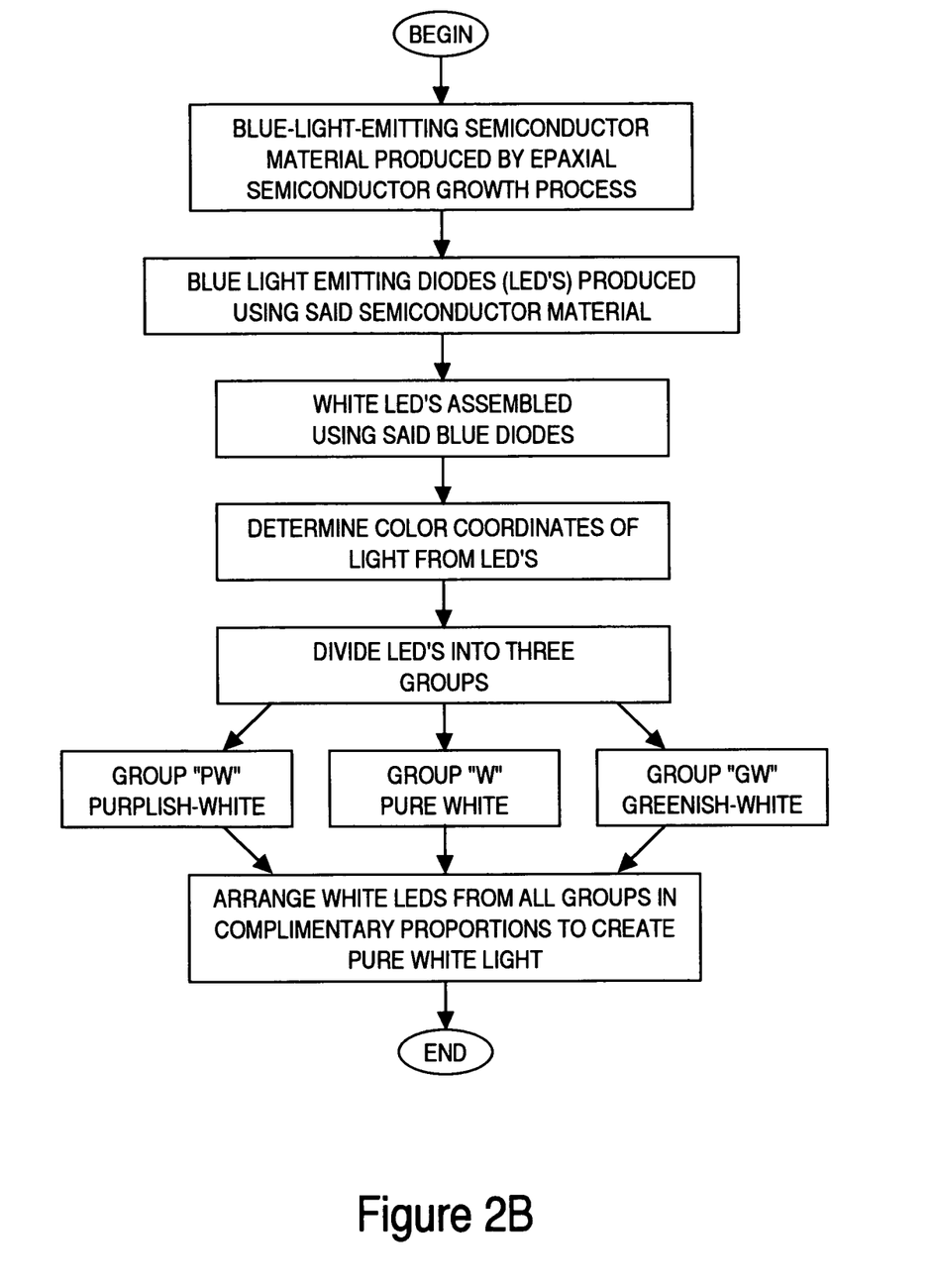
FIG. 2B is a flow chart illustrating a process for dividing off-white LED's and arranging the LED's such that their composite light is "pure" white light.

FIG. 2B illustrate an alternative system of sorting off-white and white LED's to be used to create "pure" white light. In this way, white LED's can be made using 100% of blue semiconductor material produced by conventional processes. White LEDs are divided into three groups, PW, W, and GW, depending on the color coordinates of the white resultant light of each LED. Group PW consists of purplish-white LED's made with diodes emitting light in the 460–465 nm range. Group W consists of "pure" white LED's made with diodes emitting light in the 465–470 nm range. Group GW consists of greenish-white LED's made with diodes emitting light in the 470–480 nm range.

Figure 3A:
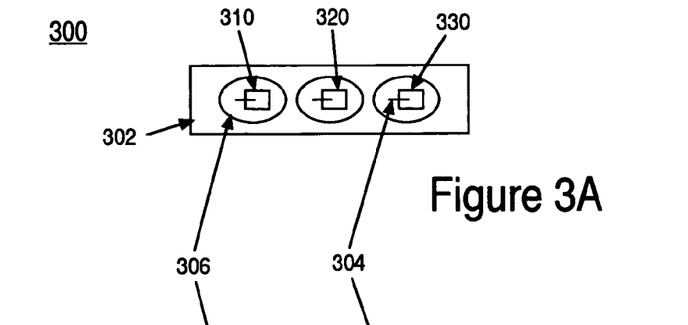
FIG. 3A is a top view of a 1×3 array of white LED's on a substrate.
Figure 3B:
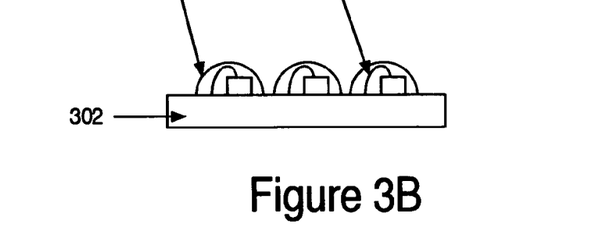
FIG. 3B is a side view of a 1×3 array of white LED's on a substrate.

FIG. 3 illustrates a possible arrangement of three white LEDs, one from each group. Array 300 is a 1×3 matrix. In a preferred embodiment, LED 310 is from Group GW, LED 320 is from Group PW, and LED 330 is from Group W (see FIG. 2). The combination of the light of these three LEDs is pure white light, as illustrated on the Chromaticity Diagram. Experimentation has shown that the actual arrangement of LEDs 310, 320 & 330 does not matter, the resultant light of any arrangement is pure white.

In FIG. 3, the diodes are coupled with a substrate 302 that has electrically conductive traces (not shown). Bond wires 304 are made from one end of the LED terminal to a conductive trace on the said substrate. A layer of encapsulant and phosphor mixture 306 covers the diodes.

Figure 4A:
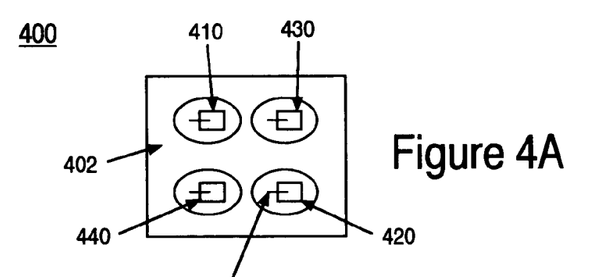
FIG. 4A is a top view of a 2×2 array of white LED's on a substrate.
Figure 4B:
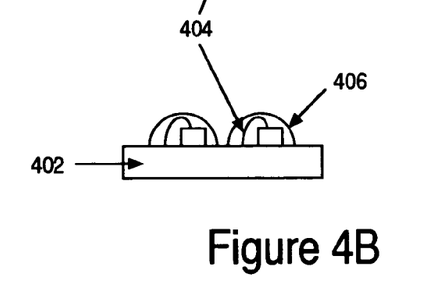
FIG. 4B is a side view of a 2×2 array of white LED's on a substrate.

FIG. 4 illustrates an array 400 of four white LEDs arranged in a 2×2 matrix. In a preferred embodiment, LEDs 410 and 420 are from Group GW, while LEDs 430 and 440 are from Group PW (see FIG. 2). In a preferred embodiment, the LEDs are arranged with 410–430 for the first row and 420–440 for the second row, as shown in FIG. 4. Experimentation has shown that the actual arrangement of LEDs 410, 420, 430 & 440 does not matter, the resultant light of any arrangement of these four LEDs is pure white.

In FIG. 4, the diodes of the LEDs are coupled with a substrate 402 that has electrically conductive traces (not shown). Bond wires 404 are made from one end of the LED terminal to a conductive trace on the said substrate. A layer of encapsulant and phosphor mixture 406 covers the diodes.

Figure 5A:
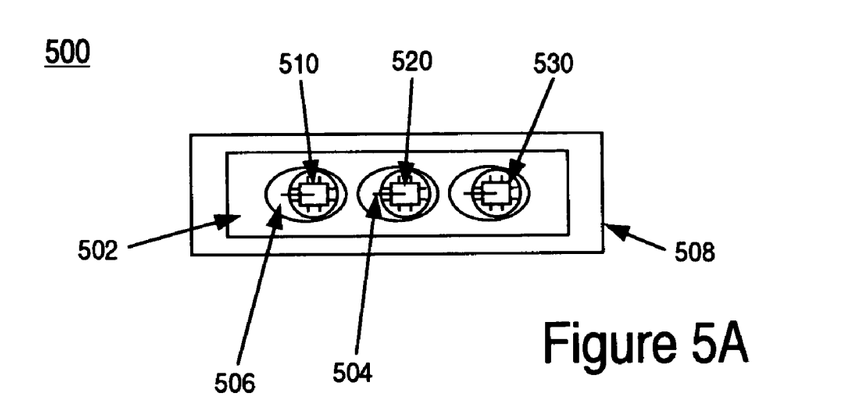
FIG. 5A is a top view of an array of white LED's in cavities on a substrate.
Figure 5B:
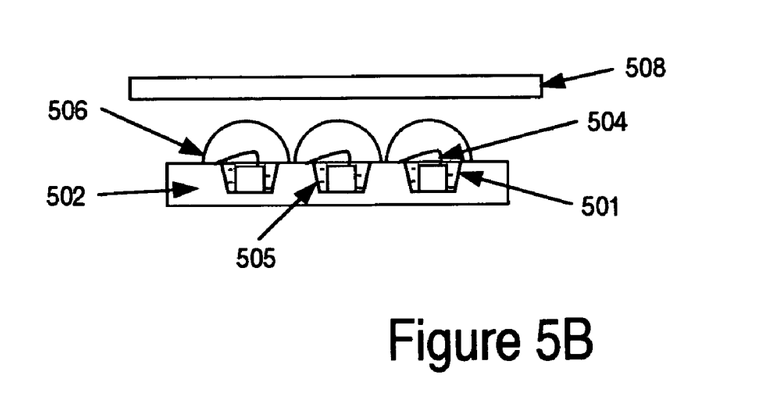
FIG. 5B is a side view of an array of white LED's in cavities on a substrate.

FIG. 5 illustrates a preferred alternative embodiment, wherein the diodes are placed in cavities in the substrate. The cavities act as reflectors, collecting light and directing it out in the desired direction. The said cavity also acts as a receptacle whereby it can be first-filled with the encapsulant/phosphor mixture, and the diode is sandwiched between this and a lens of encapsulant only. A secondary optical lens, advantageously placed over the diode, further controls and enhances the radiation pattern of light. In a preferred embodiment, a fresnel lens is used.

The encapsulant is preferably an epoxy material, but generally polymers such as thermoplastics and thermosets are suitable. Silicone or glass could also be used. The encapsulant is preferably produced by injection or transfer molding. A casting process could also be used. Alternatively, the encapsulant can be a cap placed over the diodes.

In FIG. 5, the diodes are coupled with a substrate 502 that has electrically conductive traces (not shown). The said substrate has cavities 501 which act as reflectors. Bond wires 504 are made from one end of the LED terminal to a conductive trace on the said substrate. A layer of encapsulant/phosphor mixture covers the diodes and at least partially fills the cavities. A second, lens shaped layer of encapsulant only 506 at least partially covers each diode. Alternatively, the encapsulant 506 comprises the encapsulant/phosphor mixture. A secondary lens 508 is assembled on the lens side of the LED array.

The arrangement of LED's is not limited to 1×3 or 2×2 matrices. Any array of m×n rows can be used, so long as LED's from Group PW are complimented by LED's from Group GW, and vice versa (see FIG. 2). The minimum is two LED's arranged in a 1×2 matrix. LED's from Group W do not require a complimentary LED, as they produce pure white light on their own. Furthermore, the invention is not limited to an orderly row-and-column array, but is equally effective in LED arrays of any systematic 2-dimensional or 3-dimensional sort.

Complimentary white LED's can be arranged on a substrate such as a leadframe, printed circuit board, flexible substrate, glass or ceramic. Alternatively, a plurality of complimentary white LED device components, such as lamps of the through-hole type or chipLED and PLCC of the surface mount type, can be arranged on another substrate, such as a printed circuit board, to create pure white light. These components are typically placed onto the substrate using an automated pick and place equipment and then soldered in place by heat exposure.

Figure 6:
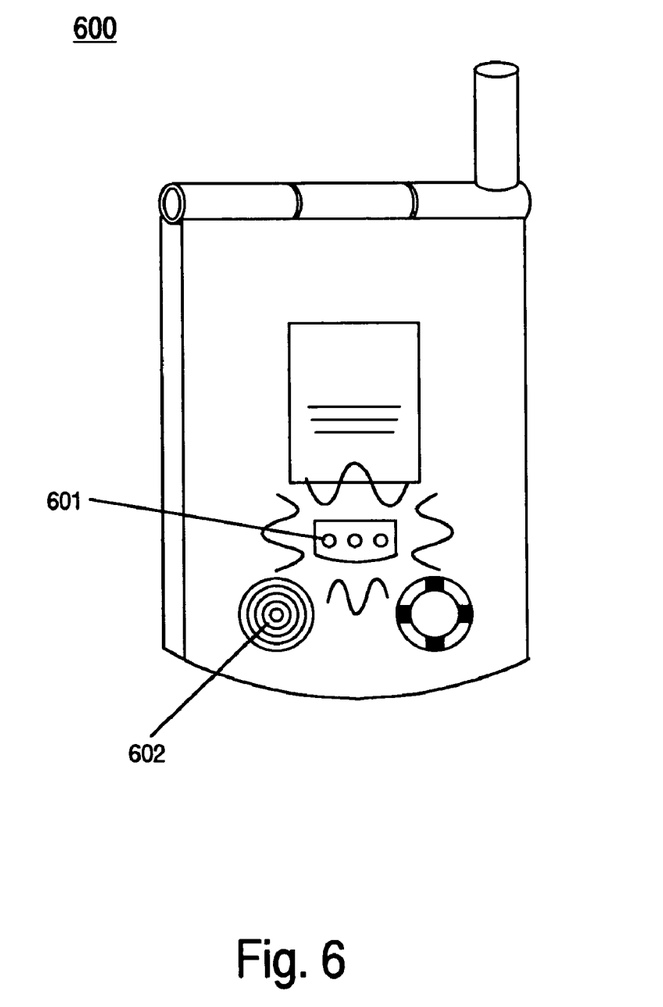
FIG. 6 is a representation of an exemplary embodiment of the invention, an image capturing device. In this case, the image capturing device is a cell phone with a camera on it, the flash for which is a 1×3 of LED's as in FIG. 3.

FIG. 6 is a representation of an exemplary embodiment of the invention, an image capturing device. The image capturing device shown here is a cell phone which has a digital camera on it. A 1×3 array 601 (see FIG. 3) provides a flash of light so that photographs can be taken in cloudy, dark, or night-time conditions.

What is claimed is:

1. A light generating apparatus comprising:
   a purplish-white light emitting diode comprising:
      a first blue light emitting diode, wherein said first blue light has a wavelength between 460 and 465 nm; and
      a first layer comprising a wavelength converting material for converting said first blue light to white light;
   a greenish-white light emitting diode comprising:
      a second blue light emitting diode, wherein said second blue light has a wavelength between 470 and 480 nm; and
      a second layer comprising said wavelength converting material,
   wherein a combination of light emanating from said purplish-white light emitting diode and said greenish-white light emitting diode is white to the human eye.

2. The apparatus of claim 1, wherein said purplish-white light emitting diode has color coordinates which lie on one side of a black body curve and said greenish-white light emitting diode has color coordinates which line on the other side of said black-body curve.

3. The apparatus of claim 1 wherein said wherein said first and second layers comprise yellow phosphor wavelength converting material.

4. The apparatus of claim 1 further comprising a plurality of purplish-white light emitting diodes and an equal number of greenish-white light emitting diodes arranged in a manner to complement said plurality of purplish-white light to produce said pure white light.

5. A white light emitting device comprising:
   a substrate with electrically conductive traces;
   an array comprising a first blue LED having a wavelength emission range of 470–480 nm and a second blue LED having a wavelength emission range of 460–465 nm, wherein said first blue LED and said second blue LED are attached to said substrate;
   encapsulant comprising yellow phosphor wavelength converting material, covering each LED, wherein a combination of converted light from said first blue LED and said second blue LED produces pure white light;
   a circuit for providing electric current to each LED.

6. The white light emitting device of claim 5 wherein said substrate has cavities onto which said first blue LED and said second blue LED are disposed thereon, said cavities acting as a reflector in collecting and directing light out in a desired direction.

7. The white light emitting device of claim 5 wherein said encapsulant and said yellow phosphor wavelength converting material are shaped in a lens configuration to impart a desired radiation pattern of emitted light.

8. The white light emitting device of claim 5 further comprising an optical lens placed over said array of LEDs used to enhance a radiation pattern of emitted light.

9. The white light emitting device of claim 5 wherein light generated by the first blue LED and the second blue LED are used to illuminate an object for an image capturing device.

* * * * *

UNITED STATES PATENT AND TRADEMARK OFFICE
CERTIFICATE OF CORRECTION

| | | |
|---|---|---|
| PATENT NO. | : 7,066,623 B2 | Page 1 of 1 |
| APPLICATION NO. | : 10/742688 | |
| DATED | : June 27, 2006 | |
| INVENTOR(S) | : Soo Ghee Lee et al. | |

It is certified that error appears in the above-identified patent and that said Letters Patent is hereby corrected as shown below:

Title Page, Col. 1, (Inventors), Line 4, delete "Pral," and insert -- Prai, --.

Column 5, Line 25, Claim 3, before "first" delete "wherein said".

Column 6, Line 22, Claim 7, delete "shaped in a" and insert -- shaped into a --.

Signed and Sealed this

Twenty-second Day of June, 2010

David J. Kappos
*Director of the United States Patent and Trademark Office*